(12) United States Patent
Zen (10) Patent No.: US 10,979,008 B2
(45) Date of Patent: Apr. 13, 2021

(54) POWER AMPLIFIER

(71) Applicant: Yamaha Corporation, Hamamatsu (JP)

(72) Inventor: Eiji Zen, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 64 days.

(21) Appl. No.: 16/450,173

(22) Filed: Jun. 24, 2019

(65) Prior Publication Data

US 2019/0393848 A1 Dec. 26, 2019

(30) Foreign Application Priority Data

Jun. 25, 2018 (JP) .............................. JP2018-119752

(51) Int. Cl.
*H03F 3/68* (2006.01)
*H03F 3/45* (2006.01)
*H03F 3/24* (2006.01)
*H03F 1/02* (2006.01)

(52) U.S. Cl.
CPC ....... *H03F 3/45071* (2013.01); *H03F 1/0277* (2013.01); *H03F 3/245* (2013.01)

(58) Field of Classification Search
USPC ..................................... 330/98, 99, 100, 255
See application file for complete search history.

(56) References Cited

U.S. PATENT DOCUMENTS 7,696,820 B1 * 4/2010 Voo .......................... H03F 1/34
330/109

FOREIGN PATENT DOCUMENTS

JP 2005-286511 A 10/2005

* cited by examiner

*Primary Examiner* — Steven J Mottola
(74) *Attorney, Agent, or Firm* — Crowell & Moring LLP (57) ABSTRACT

A power amplifier includes a first amplifier configured to output a signal based on a difference between an input signal and a feedback signal; a second amplifier that amplifies the power of the signal output from the first amplifier and outputs the amplified signal; a first feedback circuit that feeds the signal output from the second amplifier back to the first amplifier; a third amplifier that amplifies the power of the signal output from the second amplifier and outputs the amplified signal; and a second feedback circuit that feeds the signal output from the third amplifier back to the first amplifier, in which the feedback signal is a signal obtained by combining an output signal of the first feedback circuit with an output signal of the second feedback circuit.

7 Claims, 7 Drawing Sheets

POWER AMPLIFIER

CROSS REFERENCE TO RELATED APPLICATIONS

This application is based on, and claims priority from, Japanese Patent Application No. 2018-119752, filed on Jun. 25, 2018, the entire contents of which is incorporated herein by reference.

BACKGROUND

Technical Field

The present disclosure relates to, for example, power amplifiers.

BACKGROUND INFORMATION

In the technical field of power amplifying circuits that amplify input analog signals with high accuracy, a technique is known in which an output signal of a power amplifying circuit is negatively fed back to the power amplifying circuit. In particular, when both a high gain and an output signal having a relatively large amplitude are required, a configuration often used in a power amplifying circuit is a multistage configuration that includes a differential input stage and at least two amplification stages (see, for example, Japanese Patent Application Laid-Open Publication No. 2005-286511).

However, in the above technique, when a load is driven with use of an output signal of the power amplifier, it is necessary to separately provide an inductor, such as a coil, between the power amplifier and the load, in order to prevent effects of phase rotation of the output signal. Therefore, the above technique has a drawback in that it is difficult to reduce the overall size of the device when multiple different elements are arranged on a path from the power amplifier to the load.

SUMMARY

In order to solve the above problem, a power amplifier according to an aspect of the present disclosure includes a first amplifier that outputs a signal based on a difference between an input signal and a feedback signal; a second amplifier that amplifies the power of the signal output from the first amplifier and outputs an amplified signal; a first feedback circuit that feeds the signal output from the second amplifier back to the first amplifier; a third amplifier that amplifies the power of the signal output from the second amplifier and outputs an amplified signal; and a second feedback circuit that feeds the signal output from the third amplifier back to the first amplifier, wherein the feedback signal is a signal obtained by combining an output signal of the first feedback circuit with an output signal of the second feedback circuit.

DESCRIPTION OF EMBODIMENTS

An embodiment according to the present disclosure will be described with reference to the drawings.

Figure 1:
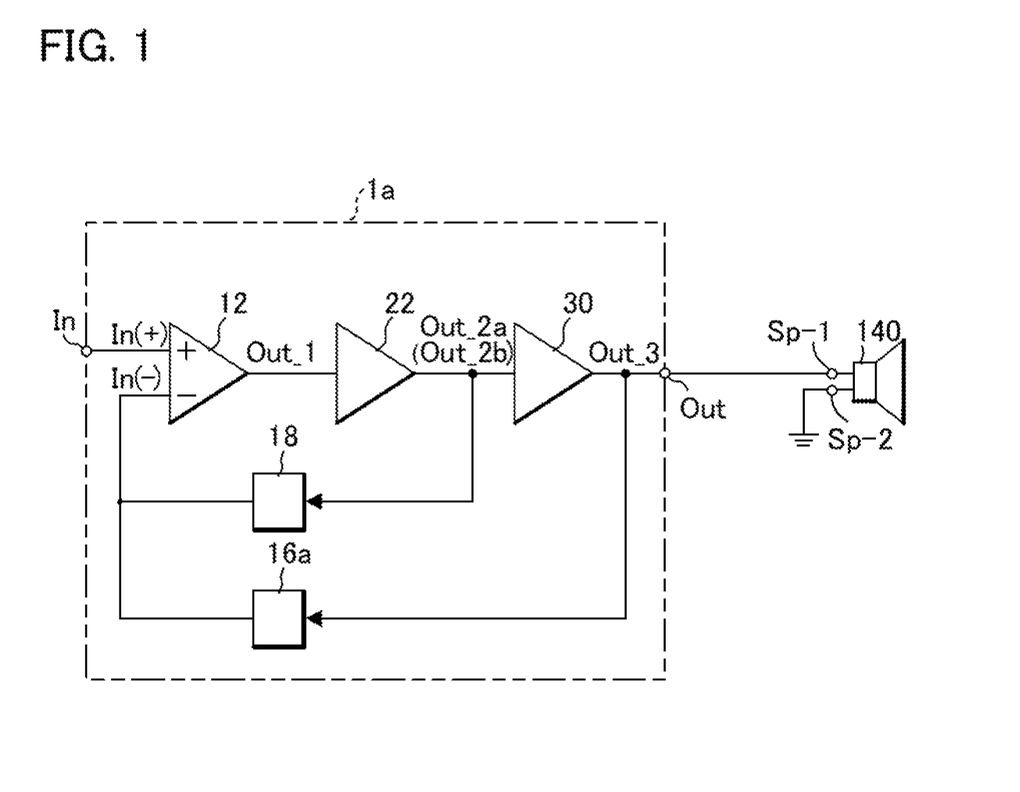
FIG. 1 is a diagram schematically illustrating a power amplifier according to an embodiment.
Figure 2:
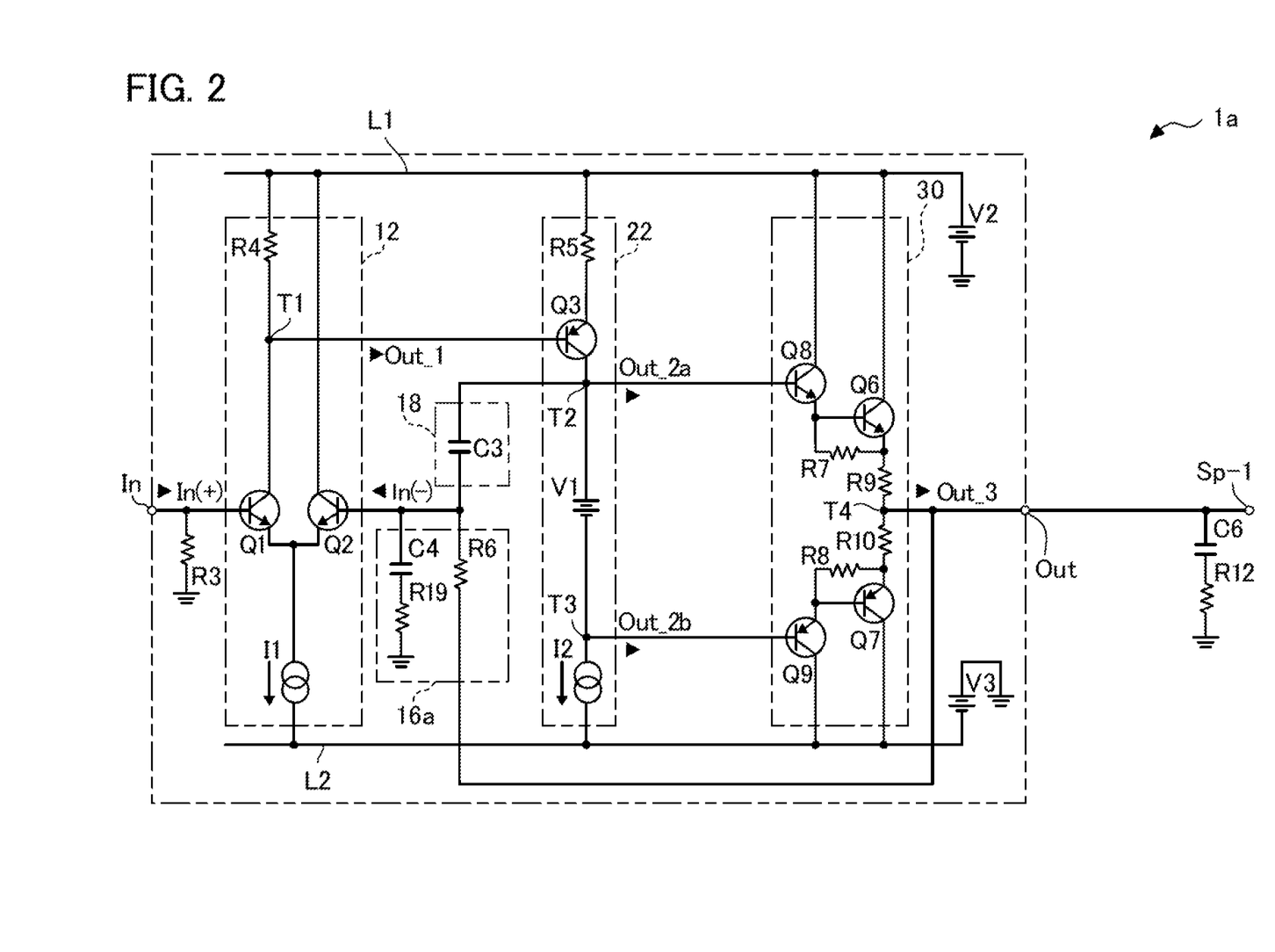
FIG. 2 is a circuit diagram illustrating the power amplifier according to the embodiment.

FIG. 1 is a block diagram illustrating a schematic configuration of a power amplifier 1a according to the embodiment. FIG. 2 is a circuit diagram illustrating a detailed configuration of the power amplifier 1a.

The power amplifier 1a amplifies the power of an analog audio signal In(+) that is supplied to an input terminal In. The power amplifier 1a outputs the amplified signal from an output terminal Out toward one input terminal Sp_1 of a speaker 140. The speaker 140 is an example of a load. The other input terminal Sp_2 of the speaker 140 is grounded.

As shown in FIGS. 1 and 2, the power amplifier 1a includes a 3-stage amplifier. Specifically, the power amplifier 1a includes a differential amplifier 12, an intermediate amplifier 22, and an output amplifier 30.

The differential amplifier 12, which is an example of a first amplifier, includes a first output terminal T1, a resistive element R4, transistors Q1 and Q2, and a constant current source I1, as illustrated in FIG. 2. The differential amplifier 12 outputs a signal Out_1 obtained by amplifying a differential voltage between the signal In(+) and a signal In(−). The resistive element R4 is an example of a first resistive element. The transistor Q1 is an example of a first transistor. The transistor Q2 is an example of a second transistor. The constant current source I1 is an example of a first constant current source. The first output terminal T1 is connected to a first potential line L1 through the resistive element R4. The first output terminal T1 is connected to one terminal of the constant current source I1 through the transistor Q1. The other terminal of the constant current source I1 is connected to a second potential line L2. The one terminal of the constant current source I1 is connected to the first potential line L1 through the transistor Q2. The signal In(+) is supplied to a control terminal of the transistor Q1. The feedback signal(−) is supplied to a control terminal of the transistor Q2.

The intermediate amplifier 22, which is an example of a second amplifier, includes a second output terminal T2, a third output terminal T3, a resistive element R5, a transistor Q3, a voltage source V1, and a constant current source I2. The intermediate amplifier 22 outputs a signal Out_2a obtained by amplifying the power of the signal Out_1, and outputs a signal Out_2b obtained by shifting the signal Out_2a to the low level side by a voltage of the voltage source V1.

The resistive element R5 is an example of a second resistive element. The transistor Q3 is an example of a third transistor. The constant current source I2 is an example of a second constant current source.

It should be noted that the signal Out_2a output from the intermediate amplifier 22 is supplied, as an input signal, to the output amplifier 30. The signal Out_2a is fed back to the differential amplifier 12 via a feedback circuit 18. The feedback circuit 18, which is an example of a first feedback circuit, includes a capacitor C3. The feedback circuit 18 removes a direct current component of the signal Out_2a and feeds the resultant signal back to the differential amplifier 12. One terminal of the resistive element R5 is connected to the first potential line L1. The other terminal of the resistive element R5 is connected to the second output terminal T2 through the transistor Q3. The second output terminal T2 is connected to the third output terminal T3 through the voltage source V1. The third output terminal T3 is connected to the second potential line L2 through the constant current source 12. The signal output from the differential amplifier 12 is supplied to a control terminal of the third transistor Q3.

The output amplifier 30, which is an example of a third amplifier, includes a fourth output terminal T4, transistors Q6, Q7, Q8, and Q9, and resistive elements R7, R8, R9, and R10. The transistor Q6 is an example of a fourth transistor. The transistor Q7 is an example of a fifth transistor. The transistor Q8 is an example of a sixth transistor. The transistor Q9 is an example of a seventh transistor. The resistive element R7 is an example of a third resistive element. The resistive element R8 is an example of a fourth resistive element. The resistive element R9 is an example of a fifth resistive element. The resistive element R10 is an example of a sixth resistive element. The transistors Q6 and Q8 form a Darlington connection. The transistors Q7 and Q9 form a Darlington connection. The transistors Q6 and Q8 are mainly driven in a positive operating voltage range. The transistors Q7 and Q9 are mainly driven in a negative operating voltage range. Thus, the transistors Q6, Q7, Q8 and Q9 are driven in a so-called push-pull scheme.

The signal Out_2a is input to the transistor Q8 that is used in the positive range. The signal Out_2b, obtained by shifting a level of the signal Out_2 to the low level side, is input to the transistor Q9 that is used in the negative range. Therefore, the positive and negative operating voltage ranges partially overlap in the push-pull driving. Therefore, in the output amplifier 30, so-called crossover distortion can be suppressed. Each transistor in the output amplifier 30 operates in class AB. However, the overlap in the operating ranges of the respective transistors in the output amplifier 30 may be increased to operate the transistors in class A.

The output amplifier 30 generates a signal Out_3 by amplifying the power of the signal Out_2. The signal Out_3 output from the output amplifier 30 is used as an output signal of the power amplifier 1a. The signal Out_3 is output from the output terminal Out toward the speaker 140. Furthermore, the signal Out_3 is fed back to the differential amplifier 12 via a feedback circuit 16a. One terminal of the resistive element R7 is connected to the first potential line L1 through the transistor Q6. The other terminal of the resistive element R7 is connected to the fourth output terminal T4 and one terminal of the resistive element R8. The other terminal of the resistive element R8 is connected to the second potential line L2 through the transistor Q7. A control terminal of the transistor Q6 is connected to the first potential line L1 through the transistor Q8. The one terminal of the resistive element R7 is connected to the control terminal of the transistor Q6 through the resistive element R9. A control terminal of the transistor Q7 is connected to the second potential line L2 through the transistor Q9. The other terminal of the resistive element R8 is connected to the control terminal of the transistor Q7 through the resistive element R10. A control terminal of the transistor Q8 is connected to the second output terminal T2. A control terminal of the transistor Q9 is connected to the third output terminal T3. The feedback circuit 16a, which is an example of a second feedback circuit, includes a capacitor C4 and resistive elements R6 and R19. The feedback circuit 16a attenuates a voltage of the signal Out_3, adjusts a phase thereof, and feeds the resultant signal back to the differential amplifier 12.

The signal In(−) to be fed back to the differential amplifier 12 is a signal obtained by combining the signal obtained by cutting the direct current component of the signal Out_2 and the signal obtained by attenuating the voltage of the signal Out_3 and by adjusting the phase thereof.

It should be noted that, in the differential amplifier 12, the intermediate amplifier 22, and the output amplifier 30, a power supply potential on the high level side that is supplied to the first potential line L1 is a potential that is higher by a voltage of a voltage source V2 than a ground potential having a zero voltage. A power supply potential on the low level side that is supplied to the second potential line L2 is a potential that is lower by a voltage of a voltage source V3 than the ground potential.

A capacitor C6 and a resistive element R12 are connected in series between the output terminal Out and the ground potential. The capacity value of the capacitor C6 and the resistance value of the resistive element R12 are determined in accordance with the load of the speaker 140.

A comparative example explaining advantages of the power amplifier 1a will be described hereinbelow.

Figure 5:
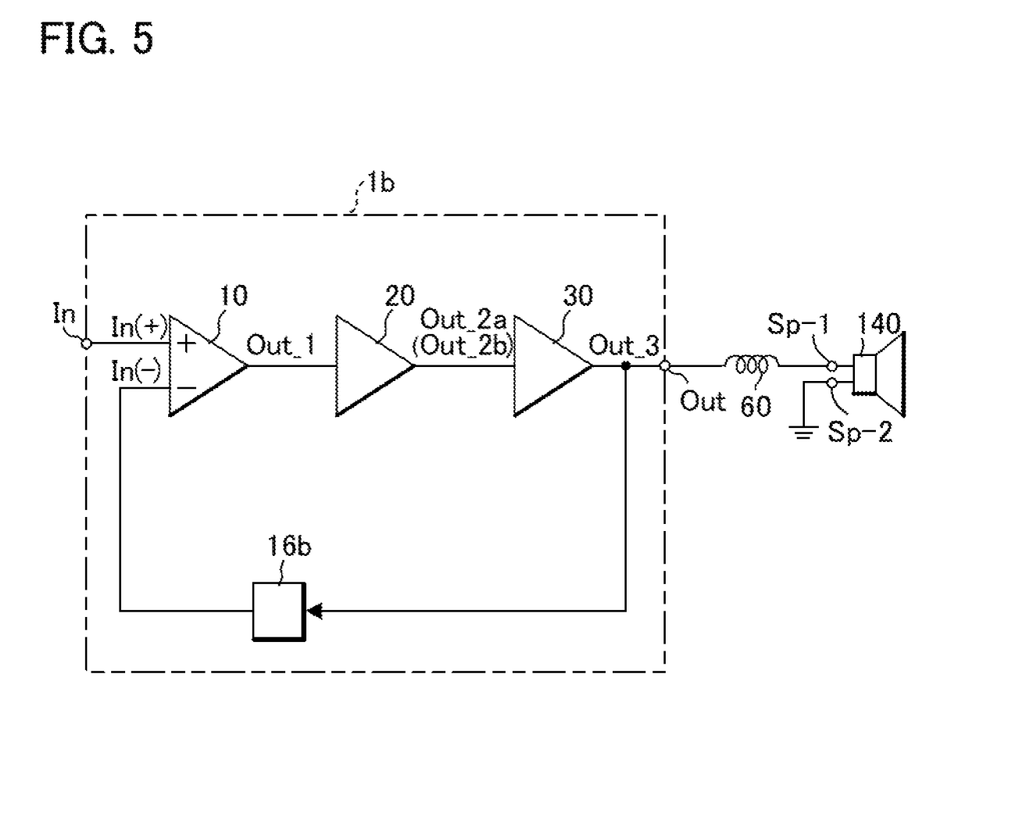
FIG. 5 is a diagram schematically illustrating a power amplifier according to a comparative example.

FIG. 5 is a block diagram illustrating a schematic configuration of the power amplifier 1b according to the comparative example.

Figure 6:
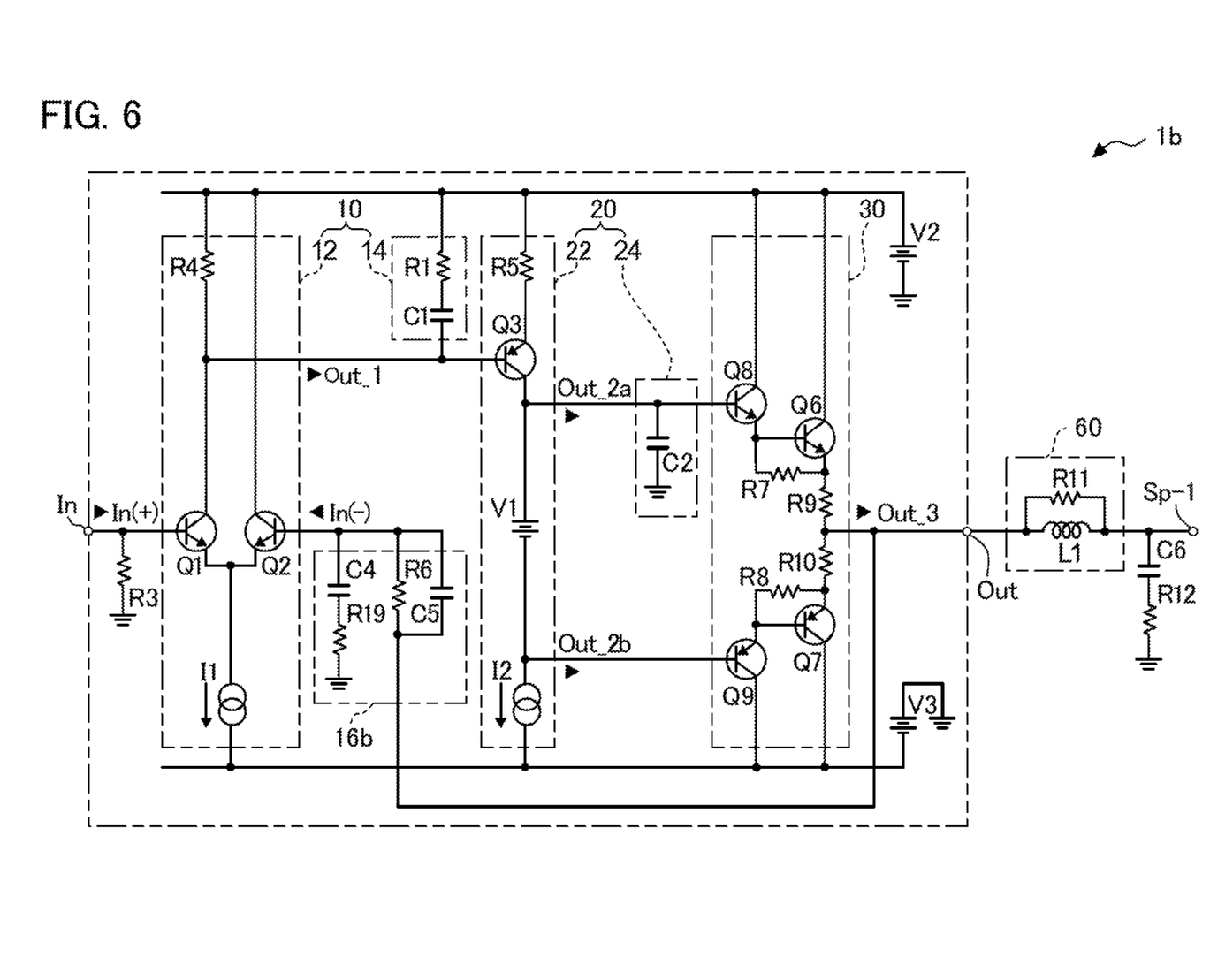
FIG. 6 is a circuit diagram illustrating the power amplifier according to the comparative example.

FIG. 6 is a circuit diagram illustrating a detailed configuration of the power amplifier 1b. FIG. 6 differs from FIG. 2 in that phase correction circuits 14 and 24 are included, the feedback circuit 18 is not included, a coil 60 is electrically inserted between the output terminal Out and the input terminal Sp-1 of the speaker 140, and the feedback circuit 16a is replaced with a feedback circuit 16b. It should be noted that in the feedback circuit 16b, a capacitor C5 is connected in parallel to a resistive element R6.

The phase correction circuit 14 includes a resistive element R1 and a capacitor C1. The phase correction circuit 14 corrects a phase of the signal Out_1 that is output from the differential amplifier 12. The phase correction circuit 24 includes a capacitor C2.

The phase correction circuit 24 corrects a phase of the signal Out_2a that is output from the intermediate amplifier 22. The phase correction circuit 24 may include a resistive element, as in the phase correction circuit 14. Further, since the signal Out_2b is a signal obtained by shifting a level of the signal Out_2a to the lower side, a phase of the signal Out_2b is corrected by the phase correction circuit 24.

The amplifier 10 in FIG. 5 is a simplified representation of an assembly including the differential amplifier 12 and the phase correction circuit 14 in FIG. 6. Similarly, an amplifier 20 in FIG. 5 is a simplified representation of an assembly including the intermediate amplifier 22 and the phase correction circuit 24 in FIG. 6.

Figure 7:
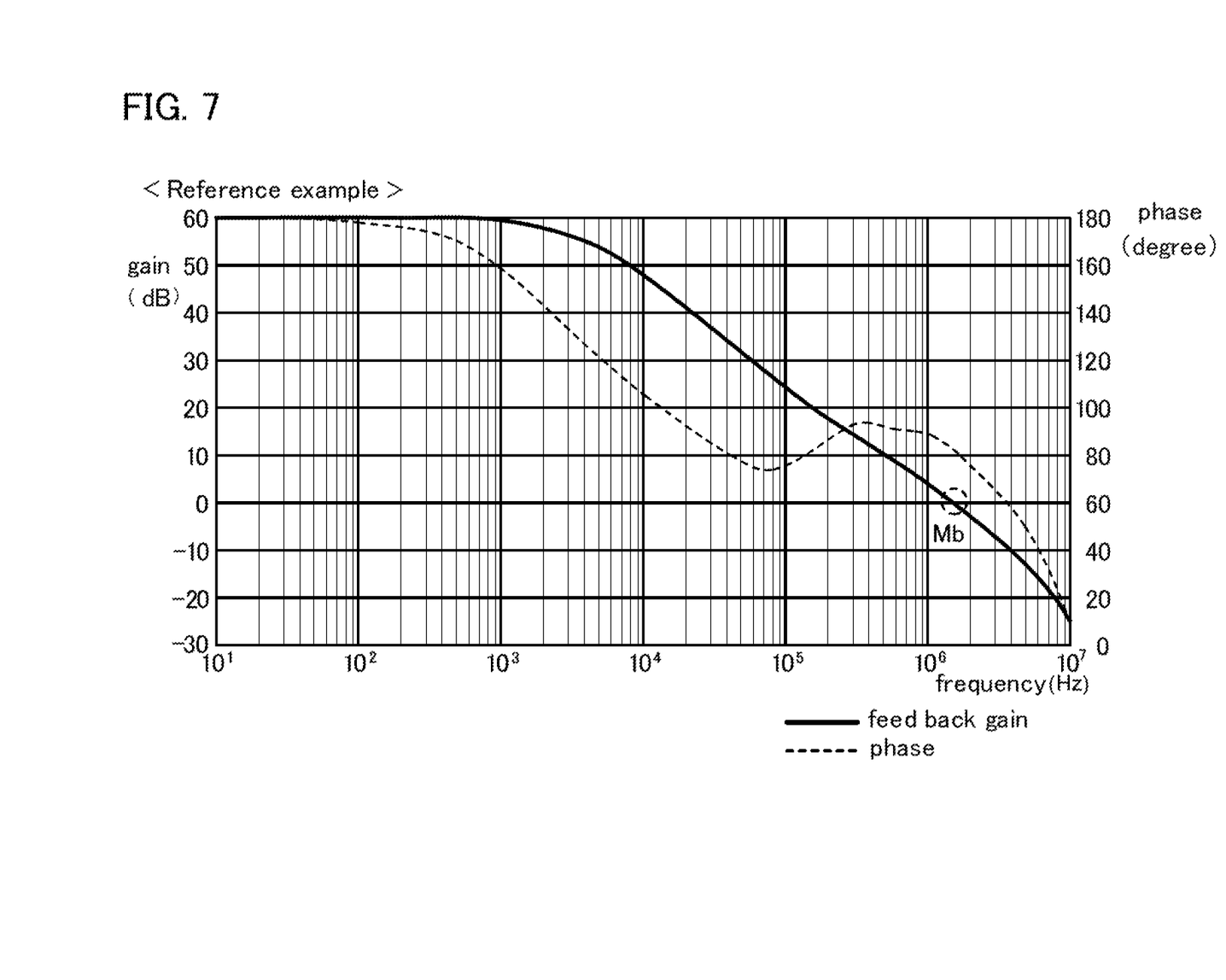
FIG. 7 is a Bode diagram illustrating characteristics of the power amplifier according to the comparative example.

FIG. 7 is a Bode diagram illustrating feedback gain characteristics and phase characteristics of the power amplifier 1b according to the comparative example in relation to different frequencies.

As illustrated in FIG. 7, a frequency in an area Mb in which the feedback gain is close to zero is relatively high in the power amplifier 1b. Therefore, in the power amplifier 1b, when a load, such as the speaker 140, is driven by the signal Out_3 to be output, it is necessary to provide the coil 60 in series between the output terminal Out and the load in order to reduce effects due to a capacitive property of the load (for example, oscillation due to phase delay, etc.).

Figure 3:
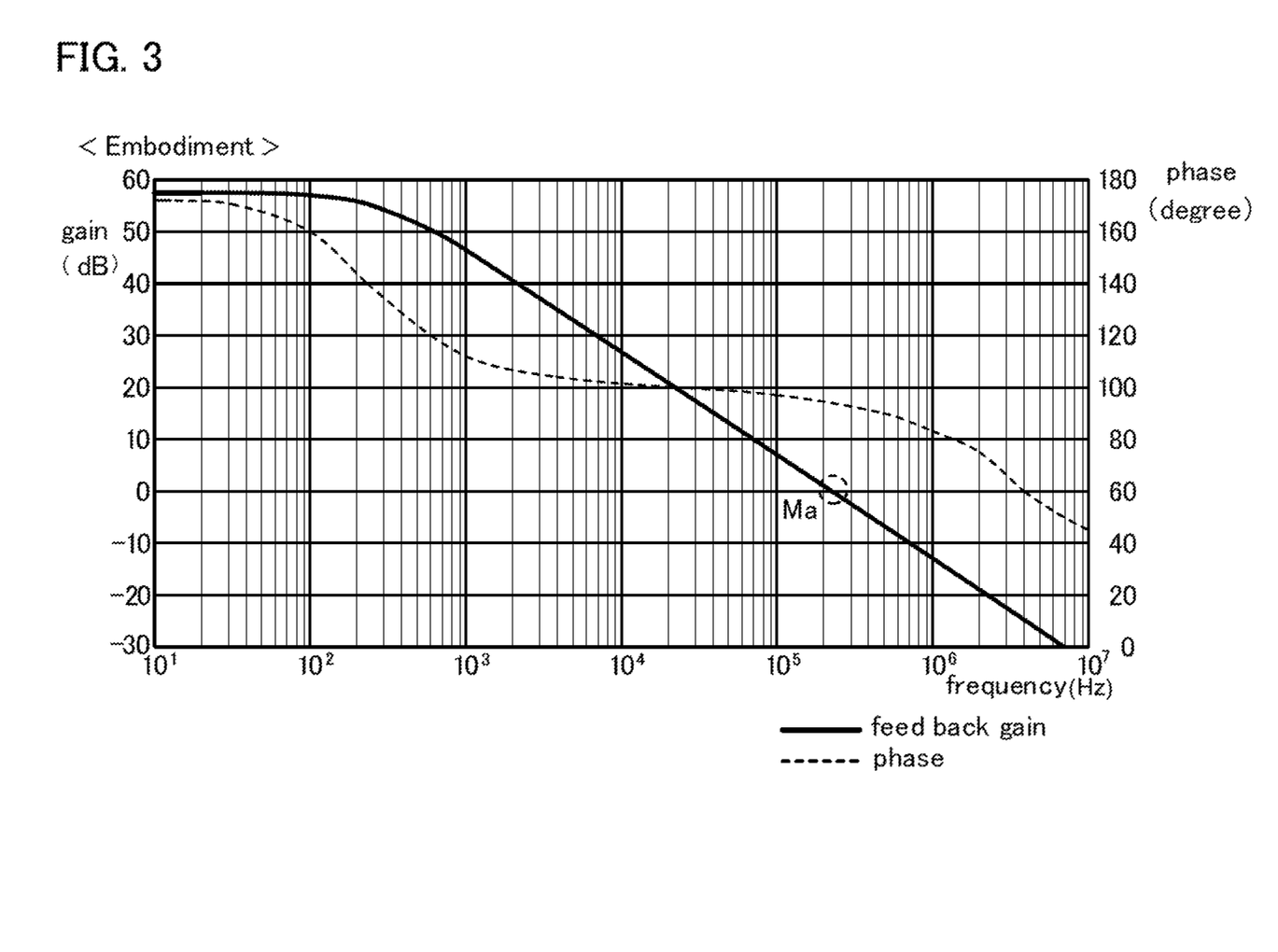
FIG. 3 is a Bode diagram illustrating characteristics of the power amplifier according to the embodiment.

FIG. 3 is a Bode diagram illustrating feedback gain characteristics and phase characteristics of the power amplifier 1a according to the embodiment.

As illustrated in FIG. 3, a frequency in an area Ma in which a loop gain is close to zero is relatively low in the power amplifier 1a. That is, in the present embodiment, since the signal Out_2 output from the intermediate amplifier 22, in addition to the signal Out_3 output from the output amplifier 30, is also fed back to the differential amplifier 12, a feedback gain from the output amplifier 30 decreases in an area in which the frequency is high.

Therefore, in the power amplifier 1a, even when a load, such as the speaker 140, is driven by the signal Out_3, it is not necessary to provide the coil 60 since effects of a capacitive property of the load is small. Therefore, when a collection of elements on the path from the power amplifier 1a to the speaker 140 is viewed in the overall device, the device can be readily reduced in size.

Furthermore, even the power amplifier 1a itself is simplified compared with the power amplifier 1b because the phase correction circuit 14 is unnecessary.

Figure 4:
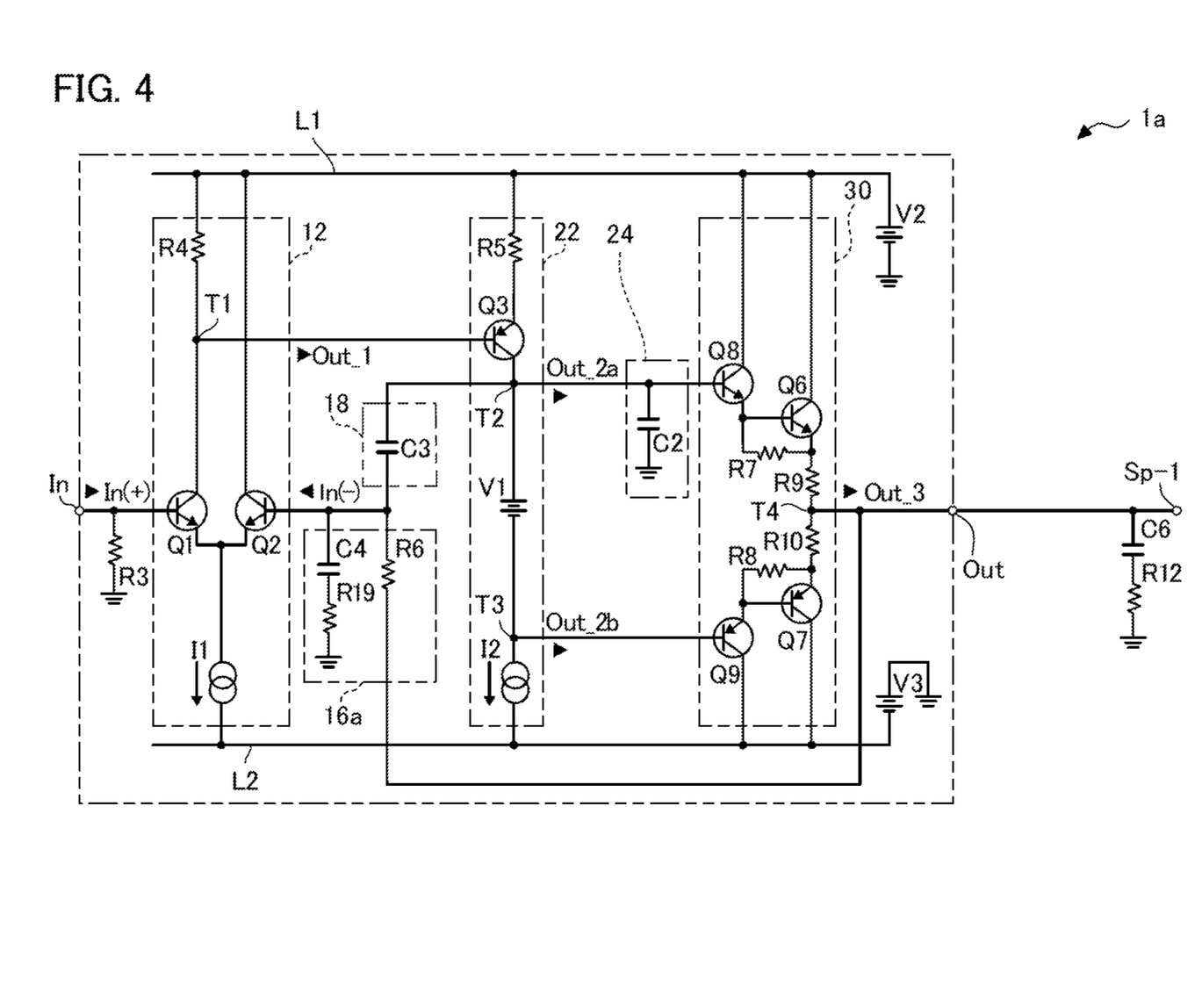
FIG. 4 is a circuit diagram illustrating a power amplifier according to an application example.

FIG. 4 is a circuit diagram according to an application example of the power amplifier 1a. As illustrated in FIG. 4, the power amplifier 1a may include a phase correction circuit 24 that corrects the phase of the signal Out_2a output from the differential amplifier 22.

Furthermore, in the power amplifier 1a, the audio signal In(+) input to the input terminal In is not limited to an analog signal but may be a digital signal. When a digital audio signal In(+) is input, the digital audio signal In(+) may be converted to an analog signal by a D/A converter, and then the analog signal may be input to the differential amplifier 12.

In the power amplifier 1a, the number of stages of the amplifiers may be "four" or more.

The power amplifier 1a may be built in an audio device with a built-in speaker.

DESCRIPTION OF REFERENCE SIGNS

1a: Power amplifier, 12: Differential amplifier (first amplifier), 16a: Feedback circuit (second feedback circuit), 18: Feedback circuit (first feedback circuit), 22: Intermediate amplifier (second amplifier), 30: Output amplifier (third amplifier), 140: Speaker, R6: Resistive element, C3: Capacitor.

What is claimed is:

1. A power amplifier comprising:
a first amplifier configured to output a signal based on a difference between an input signal and a feedback signal;
a second amplifier configured to amplify power of the signal output from the first amplifier and output the amplified signal;
a first feedback circuit configured to feed the signal output from the second amplifier back to the first amplifier;
a third amplifier configured to amplify power of the signal output from the second amplifier and output the amplified signal; and
a second feedback circuit configured to feed the signal output from the third amplifier back to the first amplifier,
wherein the feedback signal is a signal obtained by combining an output signal of the first feedback circuit with an output signal of the second feedback circuit,
wherein the first amplifier includes:
a first resistive element,
a first transistor,
a second transistor,
a first constant current source, and
a first output terminal,
wherein the first output terminal is connected to a first potential line through the first resistive element,
wherein the first output terminal is connected to one terminal of the first constant current source through the first transistor,
wherein the other terminal of the first constant current source is connected to a second potential line,
wherein the one terminal of the first constant current source is connected to the first potential line through the second transistor,
wherein the input signal is supplied to a control terminal of the first transistor, and
wherein the feedback signal is supplied to a control terminal of the second transistor.

2. The power amplifier according to claim 1,
wherein the first feedback circuit includes a capacitor.

3. The power amplifier according to claim 1,
wherein the second feedback circuit includes a resistive element.

4. The power amplifier according to claim 1,
further comprising a phase correction circuit configured to correct a phase of the signal output from the second amplifier.

5. The power amplifier according to claim 1,
wherein the input signal is an analog audio signal.

6. The power amplifier according to claim 1,
wherein the second amplifier includes:
a second resistive element,
a third transistor,
a voltage source,
a second constant current source,
a second output terminal, and
a third output terminal,
wherein one terminal of the second resistive element is connected to a first potential line,
wherein the other terminal of the second resistive element is connected to the second output terminal through the third transistor,
wherein the second output terminal is connected to the third output terminal through the voltage source,
wherein the third output terminal is connected to a second potential line through the second constant current source, and
wherein the signal output from the first amplifier is supplied to a control terminal of the third transistor.

7. The power amplifier according to claim 6,
wherein the third amplifier includes:
a fourth transistor,
a fifth transistor,
a sixth transistor,
a seventh transistor,
a third resistive element,
a fourth resistive element,
a fifth resistive element,
a sixth resistive element, and
a fourth output terminal,
wherein one terminal of the third resistive element is connected to the first potential line through the fourth transistor,
wherein the other terminal of the third resistive element is connected to the fourth output terminal and one terminal of the fourth resistive element, wherein the other terminal of the fourth resistive element is connected to the second potential line through the fifth transistor, wherein a control terminal of the fourth transistor is connected to the first potential line through the sixth transistor, wherein the one terminal of the third resistive element is connected to the control terminal of the fourth transistor through the fifth resistive element, wherein a control terminal of the fifth transistor is connected to the second potential line through the seventh transistor, wherein the other terminal of the fourth resistive element is connected to the control terminal of the fifth transistor through the sixth resistive element, wherein a control terminal of the sixth transistor is connected to the second output terminal, and wherein a control terminal of the seventh transistor is connected to the third output terminal.

* * * * *